(12) United States Patent
Kurotori

(10) Patent No.: US 12,538,603 B2
(45) Date of Patent: Jan. 27, 2026

(54) SEMICONDUCTOR DEVICE, SOLID-STATE IMAGING DEVICE, AND METHOD OF MANUFACTURING SEMICONDUCTOR DEVICE

(71) Applicant: SONY SEMICONDUCTOR SOLUTIONS CORPORATION, Kanagawa (JP)

(72) Inventor: Takuya Kurotori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 868 days.

(21) Appl. No.: 17/277,007

(22) PCT Filed: Sep. 19, 2019

(86) PCT No.: PCT/JP2019/036791
§ 371 (c)(1),
(2) Date: Apr. 11, 2022

(87) PCT Pub. No.: WO2020/066841
PCT Pub. Date: Apr. 2, 2020

(65) Prior Publication Data
US 2022/0246662 A1 Aug. 4, 2022

(30) Foreign Application Priority Data
Sep. 27, 2018 (JP) .................. 2018-181956

(51) Int. Cl.
*H10F 39/00* (2025.01)
*H01L 23/00* (2006.01)
*H10F 39/18* (2025.01)

(52) U.S. Cl.
CPC ......... *H10F 39/811* (2025.01); *H10F 39/018* (2025.01); *H10F 39/809* (2025.01);
(Continued)

(58) Field of Classification Search
CPC ......... H01L 27/14636; H01L 27/14634; H01L 27/1469; H01L 24/05; H01L 24/06;
(Continued)

(56) References Cited

U.S. PATENT DOCUMENTS 6,300,242 B1 * 10/2001 Ueda ................. H01L 21/76897
257/E21.507
2001/0014526 A1 * 8/2001 Clevenger ............... G06Q 40/04
438/619

(Continued)

FOREIGN PATENT DOCUMENTS

CN 109328395 A 2/2019
EP 3506342 A1 7/2019
(Continued)

OTHER PUBLICATIONS

International Search Report and Written Opinion of PCT Application No. PCT/JP2019/036791, issued on Nov. 26, 2019, 11 pages of ISRWO.

*Primary Examiner* — Bitew A Dinke
(74) *Attorney, Agent, or Firm* — CHIP LAW GROUP

(57) ABSTRACT

A semiconductor device includes: a multilayered wiring layer including an insulation layer (30) and a diffusion prevention layer (21, 22, 23, 24) stacked alternately and including a wiring layer (11, 12, 13) internally; a gap section (50) disposed at least in a portion of the insulation layer (30); and a support section (60) disposed at least in a portion of the gap section (50) and configured to support the multilayered wiring layer.

15 Claims, 13 Drawing Sheets

(52) U.S. Cl.
CPC .............. *H01L 24/05* (2013.01); *H01L 24/06* (2013.01); *H01L 24/08* (2013.01); *H01L 24/32* (2013.01); *H01L 24/80* (2013.01); *H01L 24/83* (2013.01); *H01L 2224/05558* (2013.01); *H01L 2224/05573* (2013.01); *H01L 2224/05647* (2013.01); *H01L 2224/06131* (2013.01); *H01L 2224/08145* (2013.01); *H01L 2224/32145* (2013.01); *H01L 2224/80895* (2013.01); *H01L 2224/83896* (2013.01); *H10F 39/182* (2025.01)

(58) Field of Classification Search
CPC ......... H01L 24/08; H01L 24/32; H01L 24/80; H01L 24/83; H01L 27/14645; H01L 2224/05558; H01L 2224/05573; H01L 2224/05647; H01L 2224/06131; H01L 2224/08145; H01L 2224/32145; H01L 2224/80895; H01L 2224/83896; H01L 21/3205; H01L 21/768; H01L 23/522; H01L 23/532; H01L 27/146; H10F 39/811; H10F 39/018; H10F 39/809; H10F 39/182; H10F 39/12
See application file for complete search history.

(56) References Cited

U.S. PATENT DOCUMENTS

| | | | | |
|---|---|---|---|---|
| 2001/0034117 | A1* | 10/2001 | Eldridge | H01L 21/7682 257/E23.138 |
| 2003/0183940 | A1* | 10/2003 | Noguchi | H01L 23/53295 257/E21.589 |
| 2004/0245637 | A1* | 12/2004 | Horak | H01L 24/05 257/758 |
| 2004/0248344 | A1* | 12/2004 | Partridge | B81C 1/00301 438/127 |
| 2005/0167841 | A1* | 8/2005 | Papa Rao | H01L 23/5329 257/E21.252 |
| 2006/0108652 | A1* | 5/2006 | Partridge | B81C 1/00261 257/419 |
| 2007/0037380 | A1* | 2/2007 | Torres | H01L 21/7682 438/619 |
| 2007/0111508 | A1* | 5/2007 | Hayashi | H01L 21/76802 438/622 |
| 2008/0169542 | A1* | 7/2008 | Suzuki | H01L 21/76801 257/E21.585 |
| 2008/0179750 | A1* | 7/2008 | Arnal | H01L 21/7682 438/622 |
| 2008/0296775 | A1* | 12/2008 | Matsunaga | H01L 23/53295 257/773 |
| 2009/0050988 | A1* | 2/2009 | Suzuki | B81C 1/00269 257/415 |
| 2009/0121356 | A1* | 5/2009 | Nakagawa | H01L 23/5222 257/E23.161 |
| 2009/0134513 | A1* | 5/2009 | Qiu | B81C 1/00095 257/734 |
| 2009/0243108 | A1* | 10/2009 | Gosset | H01L 23/53295 257/E21.586 |
| 2009/0261453 | A1* | 10/2009 | Matz | H01L 28/10 257/E27.009 |
| 2010/0130001 | A1* | 5/2010 | Noguchi | H01L 21/02697 257/E21.584 |
| 2011/0049649 | A1* | 3/2011 | Anderson | G06F 30/39 716/136 |
| 2011/0109405 | A1* | 5/2011 | Buchwalter | B81C 1/0023 333/186 |
| 2011/0121416 | A1* | 5/2011 | Quevy | B81C 1/00246 257/E21.04 |
| 2011/0316101 | A1* | 12/2011 | Dang | B81C 1/00619 716/110 |
| 2012/0037962 | A1* | 2/2012 | Breyta | H01L 23/5329 257/E21.585 |
| 2012/0270390 | A1* | 10/2012 | Noguchi | H01L 21/76834 257/E21.577 |
| 2012/0280398 | A1* | 11/2012 | Clevenger | H01L 21/31 257/770 |
| 2013/0020721 | A1* | 1/2013 | Nakae | H01L 23/544 257/E21.597 |
| 2013/0285165 | A1* | 10/2013 | Classen | B81C 1/00246 257/415 |
| 2013/0323930 | A1* | 12/2013 | Chattopadhyay | H01L 21/76829 156/345.26 |
| 2014/0145288 | A1* | 5/2014 | Hayashi | H01L 27/1469 257/435 |
| 2014/0264649 | A1* | 9/2014 | Schelling | B81C 1/0019 257/415 |
| 2015/0262929 | A1* | 9/2015 | Hsiao | H01L 21/7682 438/618 |
| 2015/0287676 | A1* | 10/2015 | Rha | H01L 21/76843 257/773 |
| 2016/0093566 | A1* | 3/2016 | Ting | H01L 21/76808 438/643 |
| 2016/0093668 | A1* | 3/2016 | Lu | H01L 23/528 257/421 |
| 2016/0247759 | A1* | 8/2016 | Rha | H01L 21/7682 |
| 2016/0264410 | A1* | 9/2016 | Brigham | B81C 1/00047 |
| 2017/0233249 | A1* | 8/2017 | Huang | B81C 1/00285 257/415 |
| 2017/0330790 | A1* | 11/2017 | He | H01L 21/76805 |
| 2017/0330832 | A1* | 11/2017 | He | H01L 27/1203 |
| 2017/0345706 | A1* | 11/2017 | Tsai | H01L 21/76805 |
| 2018/0069037 | A1* | 3/2018 | Yang | H01L 27/1463 |
| 2018/0240834 | A1* | 8/2018 | Tanaka | H01L 21/7682 |
| 2019/0181168 | A1 | 6/2019 | Kawashima | |

FOREIGN PATENT DOCUMENTS

| | | | |
|---|---|---|---|
| JP | 11-97530 A | 4/1999 | |
| JP | 2002-76116 A | 3/2002 | |
| JP | 2006-19401 A | 1/2006 | |
| JP | 2009-123775 A | 6/2009 | |
| JP | 2010-108966 A | 5/2010 | |
| JP | 2018-101699 A | 6/2018 | |
| KR | 10-2019-0040934 A | 4/2019 | |
| WO | WO-2018037667 A1 * | 3/2018 | ....... H01L 21/76805 |
| WO | 2018/116559 A1 | 6/2018 | |
| WO | 110073492 A | 7/2019 | |

* cited by examiner

SEMICONDUCTOR DEVICE, SOLID-STATE IMAGING DEVICE, AND METHOD OF MANUFACTURING SEMICONDUCTOR DEVICE

CROSS REFERENCE TO RELATED APPLICATIONS

This application is a U.S. National Phase of International Patent Application No. PCT/JP2019/036791 filed on Sep. 19, 2019, which claims priority benefit of Japanese Patent Application No. JP 2018-181956 filed in the Japan Patent Office on Sep. 27, 2018. Each of the above-referenced applications is hereby incorporated herein by reference in its entirety.

FIELD

The present disclosure relates to a semiconductor device, a solid-state imaging device, and a method of manufacturing the semiconductor device.

BACKGROUND

A semiconductor device is known in which material between wirings is removed to provide therebetween a gap (also called air gap) whose relative dielectric constant is 1, in order to reduce capacitance between the wirings.

For example, Patent Literature 1 discloses a technique capable of reducing warping in upper wiring of a semiconductor device having an air gap type multilayer wiring structure.

CITATION LIST

Patent Literature

Patent Literature 1: Japanese Patent Application Laid-open No. 2010-108966

SUMMARY

Technical Problem

The conventional technique described above, however, is provided for the purpose of reducing warping in the upper wiring, making no mention of mechanical strength for withstanding forces applied to the semiconductor device during processes such as Cu—Cu bonding or plasma bonding. Thus, the technique described in Patent Literature 1 may not be able to provide sufficient mechanical strength.

As a solution, the present disclosure proposes a semiconductor device, a solid-state imaging device, and a method of manufacturing the semiconductor device that are capable of providing sufficient mechanical strength.

Solution to Problem

To solve the problem described above, a semiconductor device according to the present disclosure includes a multilayered wiring layer including an insulation layer and a diffusion prevention layer stacked alternately and including a wiring layer internally; a gap section disposed at least in a portion of the insulation layer; and a support section disposed at least in a portion of the gap section and configured to support the multilayered wiring layer.

DESCRIPTION OF EMBODIMENTS

Figure 1:
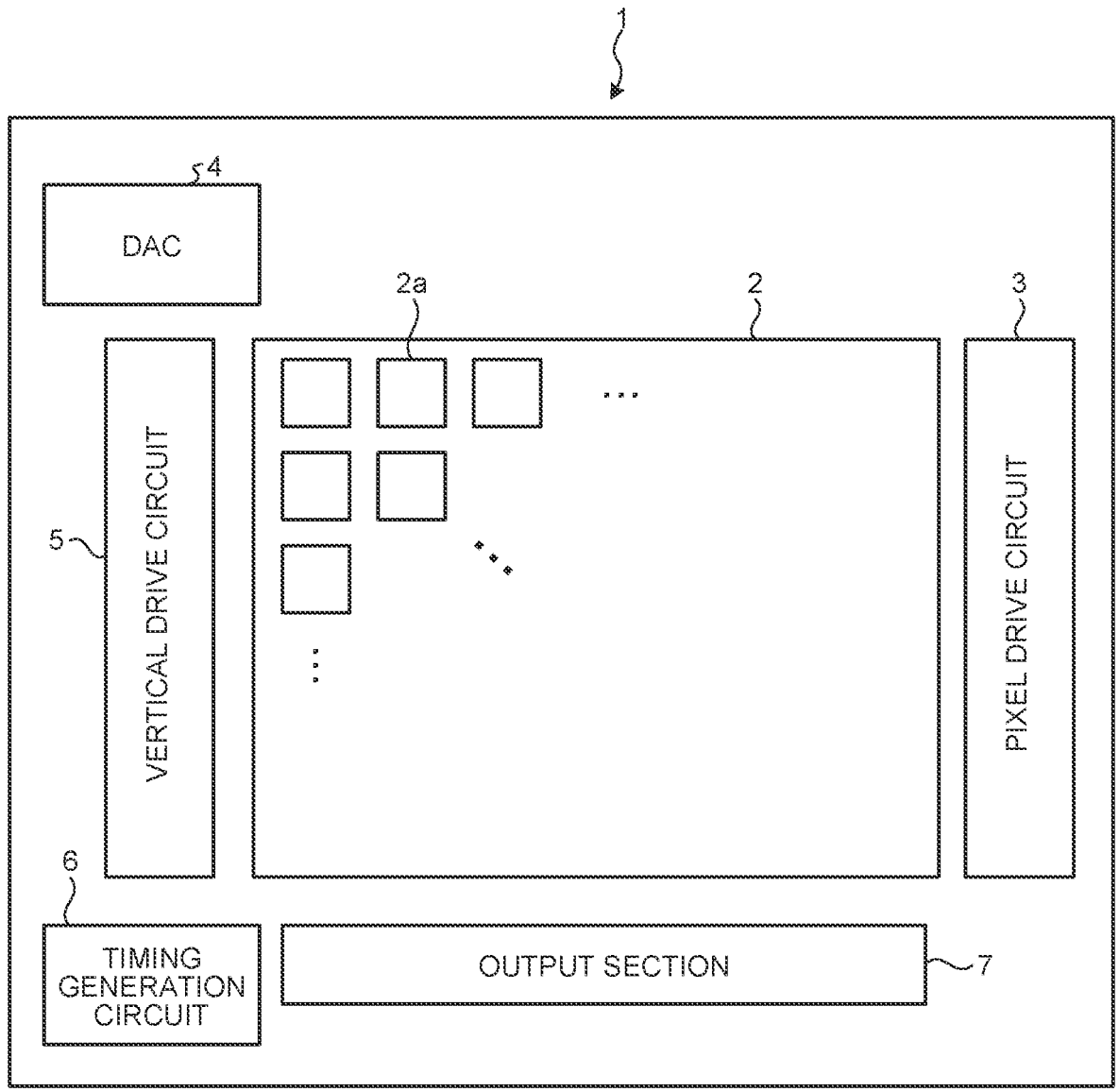
FIG. 1 is a schematic diagram illustrating an example configuration of a solid-state imaging device according to a first embodiment of the present disclosure.

Some embodiments of the present disclosure are described below in detail with reference to the drawings. In the embodiments below, like elements are denoted by like reference numerals with duplicate descriptions omitted.

The present disclosure is described in accordance with the following headings in the order below.
1. First Embodiment
1-1. Configuration example of solid-state imaging device
1-2. Configuration of section of solid-state imaging device
1-3. Method of manufacturing solid-state imaging device
1-4. Modification of support section
2. Second Embodiment
2-1. Method of manufacturing solid-state imaging device 1. First Embodiment 1-1. Configuration Example of Solid-State Imaging Device A configuration of a solid-state imaging device according to an embodiment of the present disclosure is described with reference to FIG. 1. FIG. 1 is a schematic diagram for describing a stacked structure of the solid-state imaging device according to an embodiment of the present disclosure.

As illustrated in FIG. 1, a solid-state imaging device 1 includes, for example, a pixel array section 2, a pixel drive circuit 3, a DAC (digital to analog converter) 4, a vertical drive circuit 5, a timing generation circuit 6, and an output section 7.

In the pixel array section 2, a plurality of pixels 2a are arranged in a two-dimensional array. Each of the pixels 2a includes a photoelectric conversion section and a plurality of transistors.

The pixel drive circuit 3 drives, for example, a pixel circuit constituting the pixels 2a.

The DAC 4, for example, generates a reference signal having voltage that monotonically decreases with elapsed time. The DAC 4, for example, outputs the generated reference signal to the pixels 2a.

The vertical drive circuit 5 performs, for example, control so as to output digital pixel signals generated within the pixels 2a to the output section 7 in a predetermined order based on timing signals supplied from the timing generation circuit 6.

The timing generation circuit 6 generates, for example, different types of timing signals. The timing generation circuit 6 outputs the generated different types of timing signals to, for example, the pixel drive circuit 3, the DAC 4, the vertical drive circuit 5, and the like.

1-2. Configuration of Section of Solid-State Imaging Device

Figure 2:
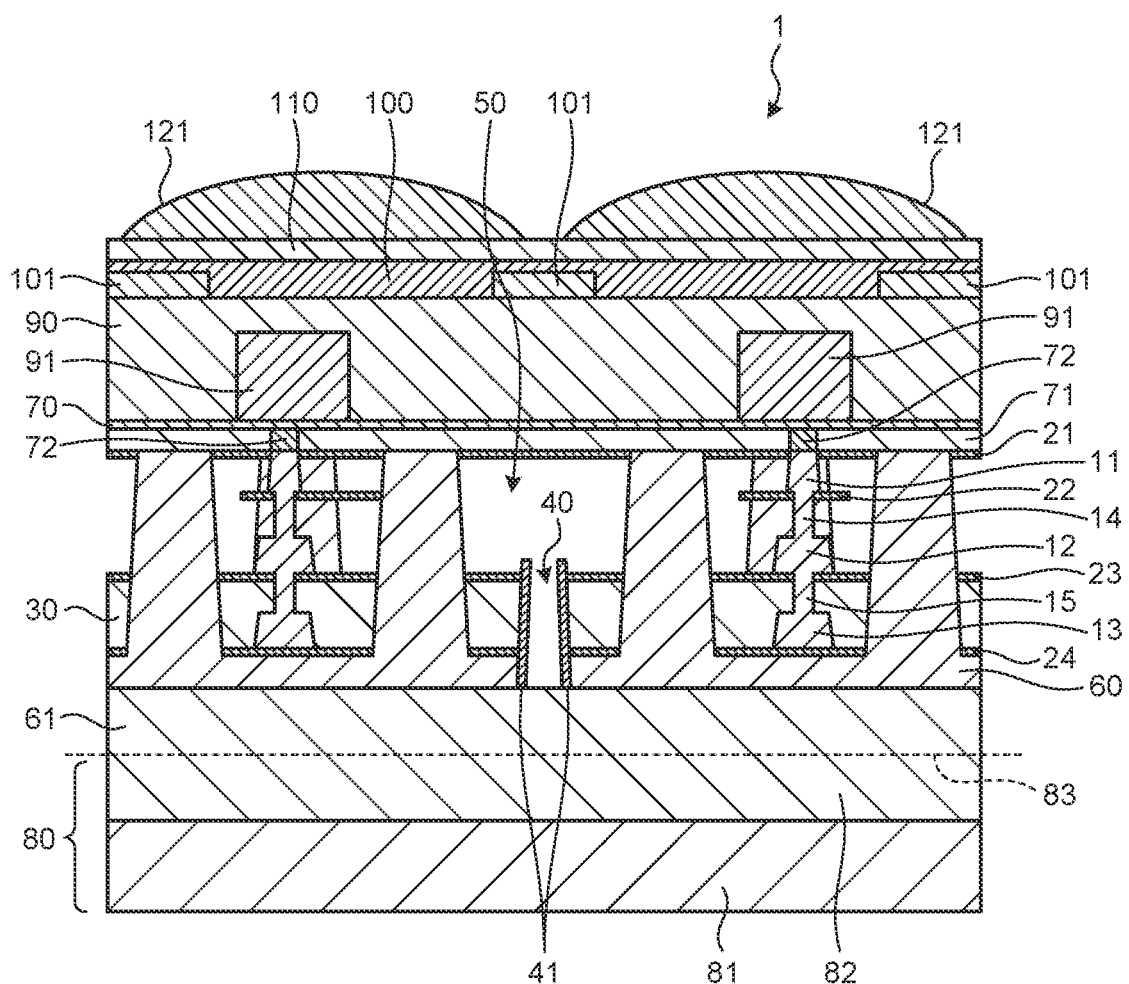
FIG. 2 is a schematic diagram illustrating an example configuration of a section of the solid-state imaging device according to the first embodiment of the present disclosure, cut in a stacking direction.

A structure of a section of the solid-state imaging device 1 according to the present embodiment is described below with reference to FIG. 2. FIG. 2 is a schematic diagram illustrating an example structure of a section of the solid-state imaging device 1 according to the present embodiment. A configuration of a solid-state imaging device is described below to provide an example and is not to be construed as limiting the present disclosure. The present disclosure can be applied to various types of semiconductor devices that include a plurality of wiring layers formed in a plurality of insulation layers.

As illustrated in FIG. 2, the solid-state imaging device 1 includes a first wiring layer 11, a second wiring layer 12, a third wiring 13, a first diffusion prevention layer 21, a second diffusion prevention layer 22, a third diffusion prevention layer 23, a fourth diffusion prevention layer 24, an insulation layer 30, a gap section (air gap) 50 formed by removing at least a portion of the insulation layer 30 by wet etching through a through hole 40, and a support section 60. The first wiring layer 11 and the second wiring layer 12 are electrically connected through a first via hole 14. The second wiring layer 12 and the third wiring layer 13 are electrically connected through a second via hole 15. A region in which the first wiring layer 11 to the third wiring layer 13, the first diffusion prevention layer 21 to the fourth diffusion prevention layer 24, and the insulation layer 30 are formed is also called a multilayered wiring layer. The multilayered wiring layer is mounted, for example, on a support substrate 80. The support substrate 80 includes a silicon wafer 81 and an oxide film 82 formed on a surface of the silicon wafer 81. The support substrate 80 is mounted on the multilayered wiring layer by, for example, plasma bonding an oxide film 61 formed on a surface of the support section 60 to the oxide film 82. A joining face 83 represents the joining face between the multilayered wiring layer and the support substrate 80. A mount substrate 70 for an image sensor, for example, is placed above the multilayered wiring layer as seen in FIG. 2. The mount substrate 70 and the first wiring layer 11 are electrically connected through a contact plug 72 provided in an oxide film 71.

A semiconductor substrate 90 is mounted on the mount substrate 70. In the semiconductor substrate 90, a photodiode 91 per pixel is formed. A plurality of transistors for reading charges accumulated in the photodiode 91 are formed in the multilayered wiring layer. A transparent insulation film (not shown), for example, is placed on the semiconductor substrate 90. The transparent insulation film is, for example, a film that allows light to pass therethrough and provides insulation, made using a material having a refractive index smaller than that of a semiconductor region of the semiconductor substrate 90. A light shield film 101 is formed on the transparent insulation film. The light shield film 101 is placed in a boundary region between pixels provided in a color filter layer 110 formed above the light shield film 101. The material for the light shield film 101 is not particularly limited as long as it can interrupt light. A planarization film 100 is placed over the light shield film 101 and the transparent insulation film. The material for the planarization film 100 can be, for example, an organic material such as resin. The color filter layer 110 in, for example, red, green, or blue for each pixel is formed on the planarization film 100. The color filter layer 110 is formed by, for example, spin coating photosensitive resin containing a coloring, such as pigment or dye. An on-chip lens 121 for each pixel is formed on the color filter layer 110. The on-chip lens 121 is formed using, for example, a resin-based material, such as styrene resin, acrylic resin, styrene-acrylic copolymer resin, or siloxane resin.

A configuration placed above the mount substrate 70 is described roughly to provide an example and is not to be construed as limiting the present disclosure. In the present disclosure, the structure of the mount substrate 70 can be configured as desired.

A configuration of the multilayered wiring layer is described in further detail below.

The solid-state imaging device 1 has a structure in which the first diffusion prevention layer 21 to the fourth diffusion prevention layer 24 and the insulation layer 30 are stacked alternately. In this case, the first wiring layer 11 to the third wiring layer 13 are placed in layers of the insulation layer 30 that are sectioned by the first diffusion prevention layer 21 to the fourth diffusion prevention layer 24. Although the solid-state imaging device 1 as depicted in FIG. 2 has a three-layer structure, this provides an example and is not to be construed as limiting the present disclosure. In the present disclosure, the solid-state imaging device 1 may include, for example, three or more wiring layers stacked therein. In the present disclosure, the solid-state imaging device 1 may include, for example, fewer than three wiring layers.

The first wiring layer 11 to the third wiring layer 13 transmit an electric current or voltage across elements provided in the solid-state imaging device 1. The first wiring layer 11 to the third wiring layer 13 are formed using, for example, a metal material having relatively high conductivity. The first wiring layer 11 to the third wiring layer 13 are formed using, for example, copper, tungsten, or aluminum. The first wiring layer 11 to the third wiring layer 13 may be formed using an alloy including copper, tungsten, or aluminum. The first wiring layer 11 to the third wiring layer 13 may include on surfaces thereof a barrier metal layer having high barrier properties. The barrier metal layer is formed using a metal such as tantalum, titanium, ruthenium, cobalt, manganese, or the like. The barrier metal layer may be formed using a nitride of or an oxide of tantalum, titanium, ruthenium, cobalt, manganese, or the like.

The first via hole 14 and the second via hole 15 electrically connect wiring layers placed in different insulation layers. Specifically, the first via hole 14 electrically connects the first wiring layer 11 and the second wiring layer 12. The second via hole 15 electrically connects the second wiring layer 12 and the third wiring layer 13. The first via hole 14 and the second via hole 15 are formed using, for example, a metal similar to that used for the first wiring layer 11 to the third wiring layer 13. The first via hole 14 and the second via hole 15 may include on surfaces thereof a barrier metal layer in a similar fashion to the first wiring layer 11 to the third wiring layer 13.

The first diffusion prevention layer 21 to the fourth diffusion prevention layer 24 are placed so as to sandwich the layers of the insulation layer 30. The first diffusion prevention layer 21 to the fourth diffusion prevention layer 24 inhibit surface diffusion of metal atoms of the first wiring layer 11 to the third wiring layer 13. The first diffusion prevention layer 21 to the fourth diffusion prevention layer 24 also serve as stoppers while their respective upper layers are processed. The first diffusion prevention layer 21 to the fourth diffusion prevention layer 24 are formed using, for example, an insulating material having an etching resistance higher than that of the insulation layer 30. Specifically, the first diffusion prevention layer 21 to the fourth diffusion prevention layer 24 are formed using, for example, an insulating material such as $SiN_x$ (silicon nitride), SiCN (silicon carbide nitride), SiON (silicon oxynitride), SiC (silicon carbide), or the like.

The insulation layer 30 is a layer-forming material for the solid-state imaging device 1. The insulation layer 30 electrically insulates the first wiring layer 11 to the third wiring layer 13 from one another. The insulation layer 30 is formed using an insulating material that can be etched more easily than those of the first diffusion prevention layer 21 to the fourth diffusion prevention layer 24. The insulation layer 30 is formed by using, for example, an insulating material such as $SiO_x$.

The through hole 40 is formed so as to penetrate from the insulation layer 30 at one of surfaces of the multilayered wiring layer through at least one of the first diffusion prevention layer 21 to the fourth diffusion prevention layer 24. The through hole 40 may have a rectangular or circular shape.

A side wall protection film 41 is placed on an inner side of the through hole 40. The side wall protection film 41 protects the insulation layer 30 where it is exposed by the through hole 40, against wet etching. The side wall protection film 41 protects a region of the insulation layer 30 in which region the third wiring layer 13 is placed, while the gap section 50 is formed. The side wall protection film 41 is thus formed using, for example, an insulating material having an etching resistance higher than that of the insulation layer 30. Specifically, the side wall protection film 41 is formed using an insulating material such as $SiN_x$, SiCN, SiON, SiC, or the like.

The gap section 50 is a hollow region formed at least in a portion of the insulation layer 30. The gap section 50 is formed by introducing an etchant through the through hole 40 and wet etching the insulation layer 30 where the first wiring layer 11 and the second wiring layer 12 are placed, specifics of which will be described below. In other words, the gap section 50 is placed in a region where the first wiring layer 11 and the second wiring layer 12 are formed. The gap section 50 provides a hollow area in the space in which the first wiring layer 11 and the second wiring layer 12 are formed, thereby achieving a relative dielectric constant of 1. The gap section 50 can thus reduce the inter-wiring capacitance between the first wiring layer 11 and the second wiring layer 12. Thus, the gap section 50 is preferably formed across the entire insulation layer 30.

The support section 60 is placed at least in a portion of the gap section 50. Specifically, the support section 60 is provided so as to improve mechanical strength of the multilayered wiring layer. The number of such support sections 60 may be only one, or more than one. The support section 60 has, for example, a columnar shape, formed so as to support the insulation layer 30, which forms the multilayered wiring layer. In this case, the support section 60 may be positioned exactly at a place where the mechanical strength is below a predefined threshold value. The support section 60 may extend, for example, across the multilayered wiring layer from an upper portion to a lower portion thereof.

The support section 60 is formed by using a material having a relatively high etching resistance to wet etching, specifics of which will be described below. The support section 60 is formed using, for example, an insulating material such as $SiN_x$, SiCN, SiON, SiC, or the like. The support section 60 may be formed using metal as long as the metal material can maintain etching resistance.

In the present embodiment, providing the support section 60 at the multilayered wiring layer can ensure that the multilayered wiring layer has sufficient mechanical strength.

Specifically, the support section 60 prevents fracture of the multilayered wiring layer caused by forces applied to the multilayered wiring layer during processes such as plasma bonding or Cu—Cu bonding.

The mount substrate 70 is a substrate formed using different types of semiconductors and may be a substrate of, for example, polycrystal, single-crystal, or amorphous silicon. As described above, different types of semiconductor elements, such as the photodiode 91, are mounted on the mount substrate 70 in the present embodiment.

The contact plug 72 is provided in the oxide film 71 formed on a surface of the mount substrate and electrically connects an electrode or wiring of a semiconductor element or the like mounted on the mount substrate 70 to the first wiring layer 11. The contact plug 72 is formed using, for example, a metal similar to that used for the first via hole 14 and the second via hole 15.

1-3. Method of Manufacturing Solid-State Imaging Device

A method of manufacturing the solid-state imaging device according to the present embodiment is described below with reference to FIGS. 3 to 11. FIGS. 3 to 11 are schematic diagrams for describing a method of manufacturing the solid-state imaging device according to the present embodiment.

First, the insulation layer 30 is formed on the mount substrate 70. Note that the mount substrate 70 as discussed here includes different types of transistors for performing signal processing as an integrated circuit as well as a diffusion layer formed therein. Then, the first diffusion prevention layer 21 is formed on the insulation layer 30, and the insulation layer 30 is further formed on the first diffusion prevention layer 21 (this part of the process not shown). Next, by obtaining lithography and dry etching, a hole for forming the first wiring layer 11 is formed. Then, the hole is filled by, for example, tungsten CVD (chemical vapor deposition) and planarization is achieved by CMP (chemical mechanical polishing) to thereby form the first wiring layer 11. This process is repeated until the third wiring layer 13 is formed. Note that, after the second diffusion prevention layer 22 is formed on the first wiring layer 11, a through hole is formed in the second diffusion prevention layer 22. In other words, the second diffusion prevention layer 22 is removed. After the third wiring layer 13 is formed, film deposition is performed to the through hole using the insulation layer 30. Also note that the first via hole 14, which electrically connects the first wiring layer 11 and the second wiring layer 12, is formed in the second diffusion prevention layer 22. The second via hole 15, which electrically connects the second wiring layer 12 and the third wiring layer 13, is formed in the third diffusion prevention layer 23.

Figure 3:
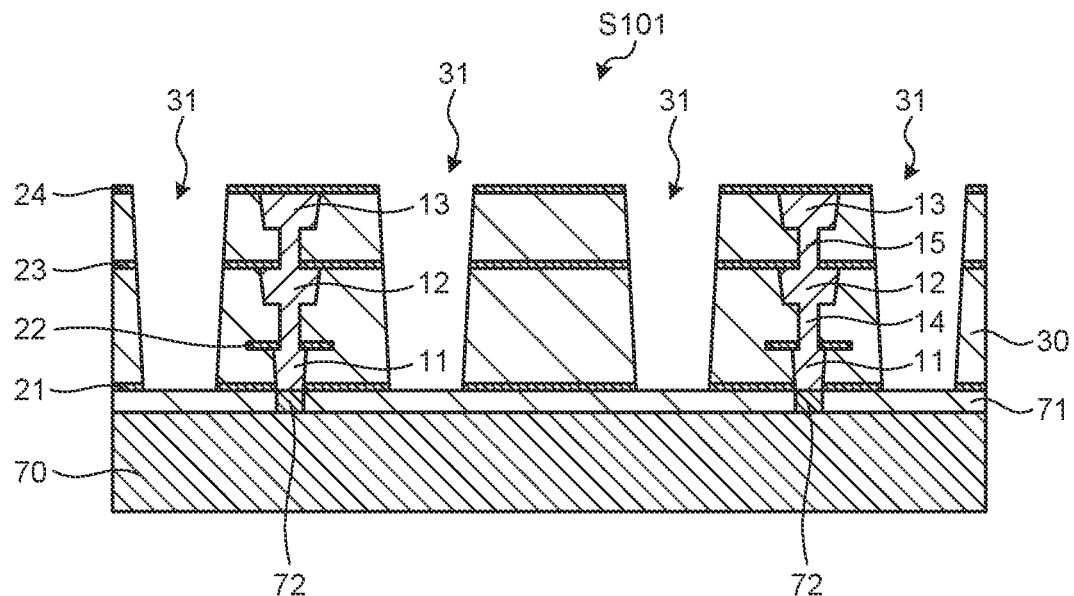
FIG. 3 is a schematic diagram for describing an example method of manufacturing the solid-state imaging device according to the first embodiment of the present disclosure.

Subsequently, as illustrated in FIG. 3, an RDV (rapid deep via) 31 is formed in the insulation layer 30 (step S101). Specifically, the RDV 31 is formed by performing lithography and dry etching to the insulation layer 30. The size (diameter) of the RDV 31 is, for example, 100 to 150 nm. The depth of the RDV 31 corresponds to a thickness of the insulation layer 30 from the first wiring layer 11 to the third wiring layer 13 and is, for example, 1350 to 1700 nm. In this case, the aspect ratio of the diameter to depth of the RDV 31 is 9 to 17.

Figure 4:
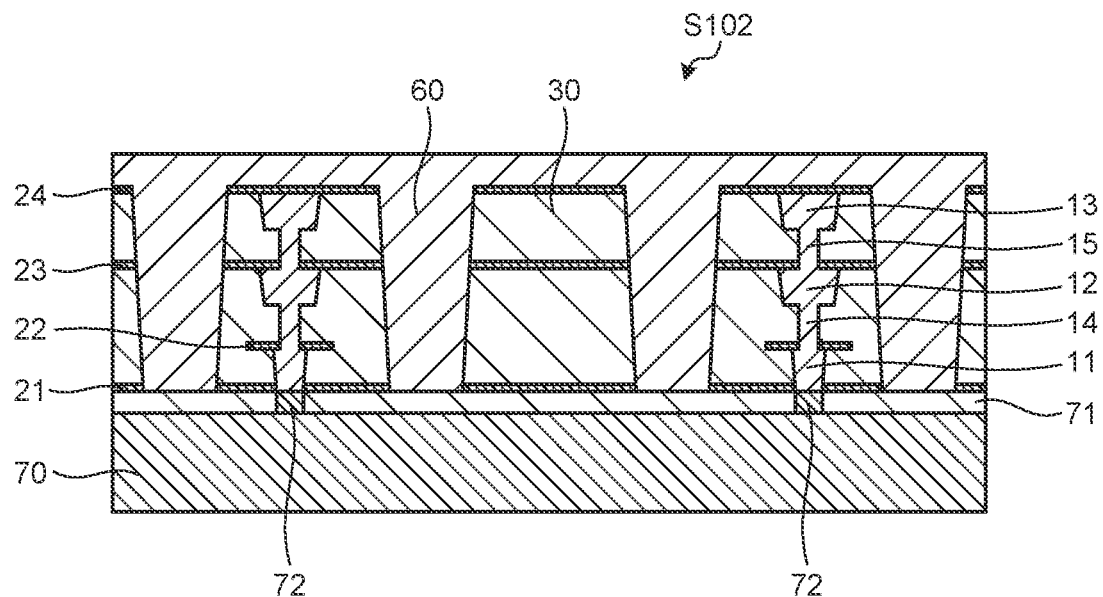
FIG. 4 is a schematic diagram for describing the example method of manufacturing the solid-state imaging device according to the first embodiment of the present disclosure.

Subsequently, as illustrated in FIG. 4, the RDV 31 is filled by a process such as cyclic-CVD or ALD (atomic layer deposition) with a material having etching resistance to a chemical solution used in the wet etching performed to form the gap section (for example, resistance to a fluorine compound) (step S102). Specifically, the support section 60 is formed by filling the RDV 31 with a SiN, SiCN, SiCO, or SiC film. A gap may be present in the support section 60 as long as the mechanical strength can be maintained. The support section 60 may be formed by filling the RDV 31 with metal as long as the etching resistance to wet etching can be maintained.

Figure 5:
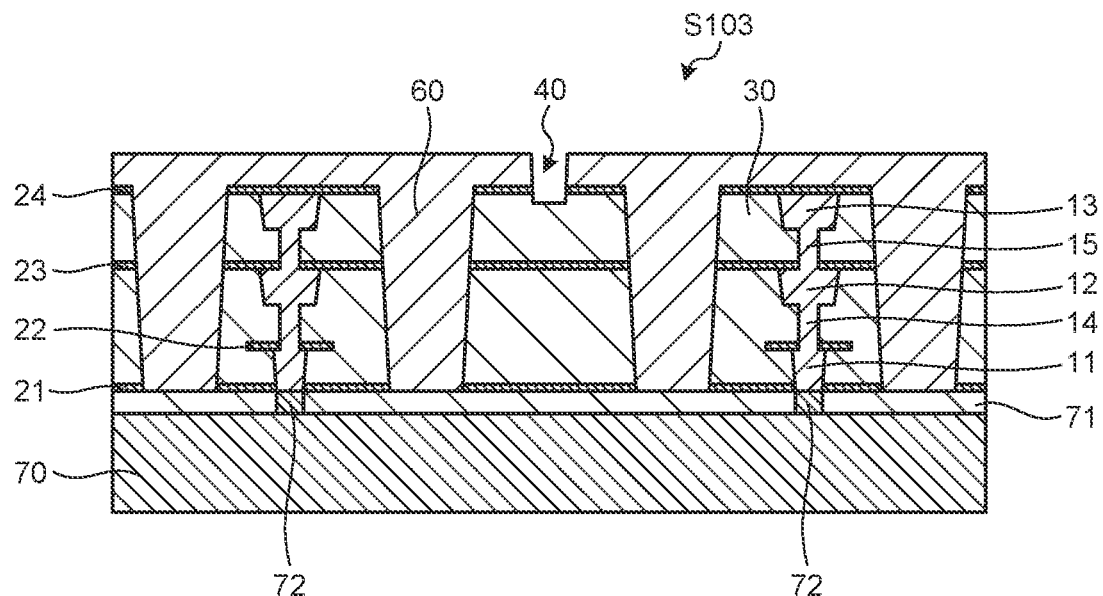
FIG. 5 is a schematic diagram for describing the example method of manufacturing the solid-state imaging device according to the first embodiment of the present disclosure.

Subsequently, as illustrated in FIG. 5, the through hole 40 is formed by performing lithography and dry etching to the surface of the support section 60 into the insulation layer 30 where the third wiring layer 13 is formed (step S103).

Figure 6:
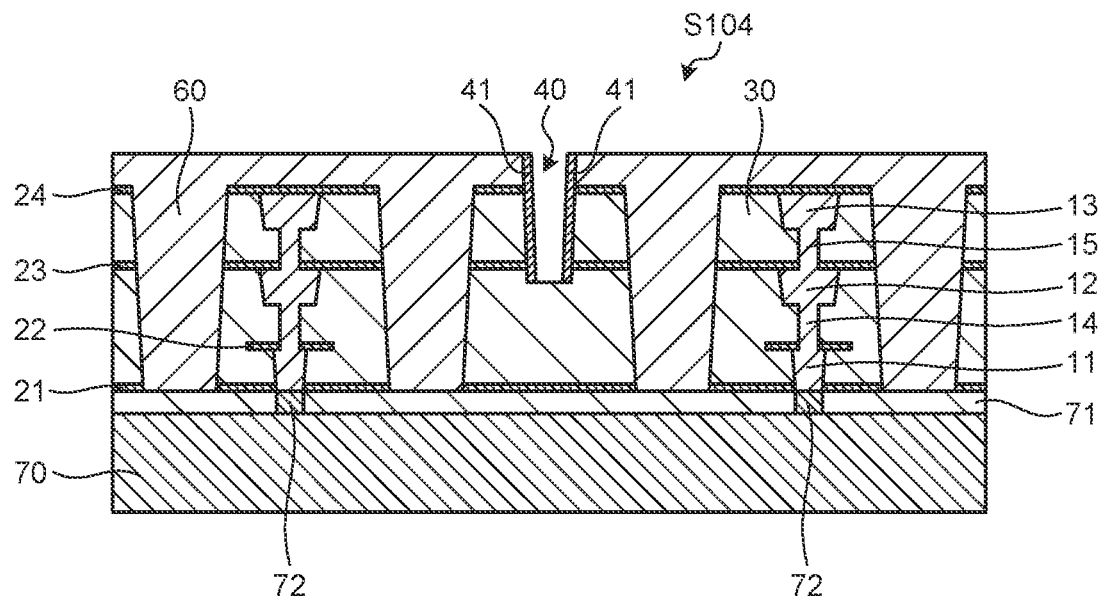
FIG. 6 is a schematic diagram for describing the example method of manufacturing the solid-state imaging device according to the first embodiment of the present disclosure.

Then, as illustrated in FIG. 6, the side wall protection film 41 is formed on the inner side of the through hole 40, and an etch back process is performed to the bottom surface so as to increase the depth of the through hole 40 to thereby reach a layer in which the first wiring layer 11 and the second wiring layer 12 are formed (step S104). The side wall protection film 41 can be formed by, for example, performing ALD. As described above, the side wall protection film 41 is formed using, for example, SiN, SiCN, SiCO, or SiC, which has the etching resistance to wet etching.

Figure 7:
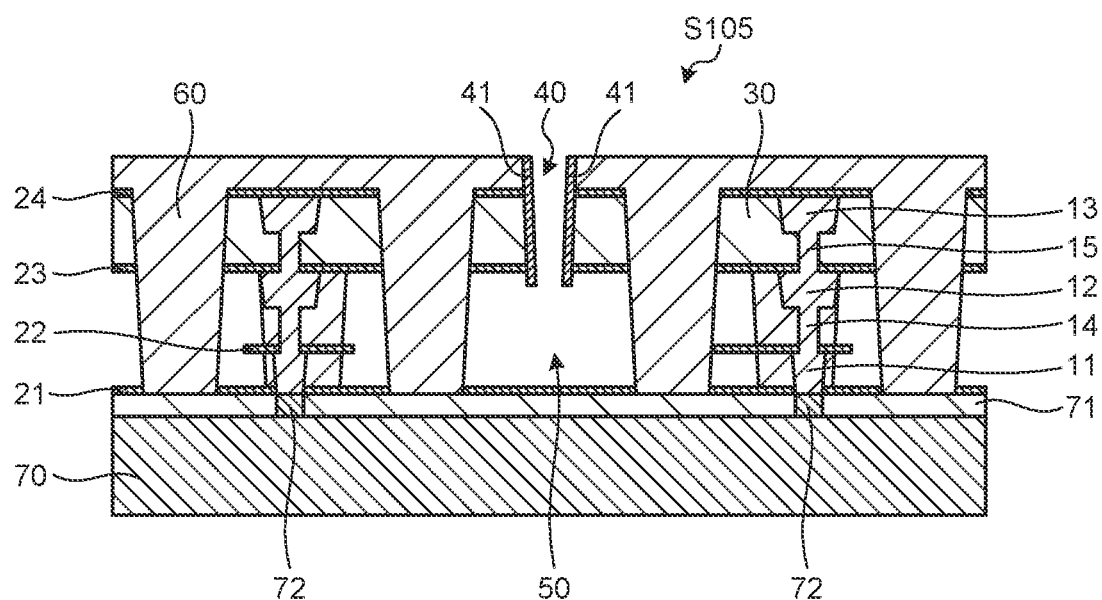
FIG. 7 is a schematic diagram for describing the example method of manufacturing the solid-state imaging device according to the first embodiment of the present disclosure.

Then, as illustrated in FIG. 7, an etchant is introduced through the through hole 40 to remove at least one layer of the insulation layer 30 in which the first wiring layer 11 and the second wiring layer 12 are formed to thereby form the gap section 50 (step S105). As illustrated in FIG. 7, since the support section 60 is formed using a material having a resistance to wet etching, the support section 60 is not removed by the wet etching. Thus, the support section 60 having a columnar shape is formed at the gap section 50.

Figure 8:
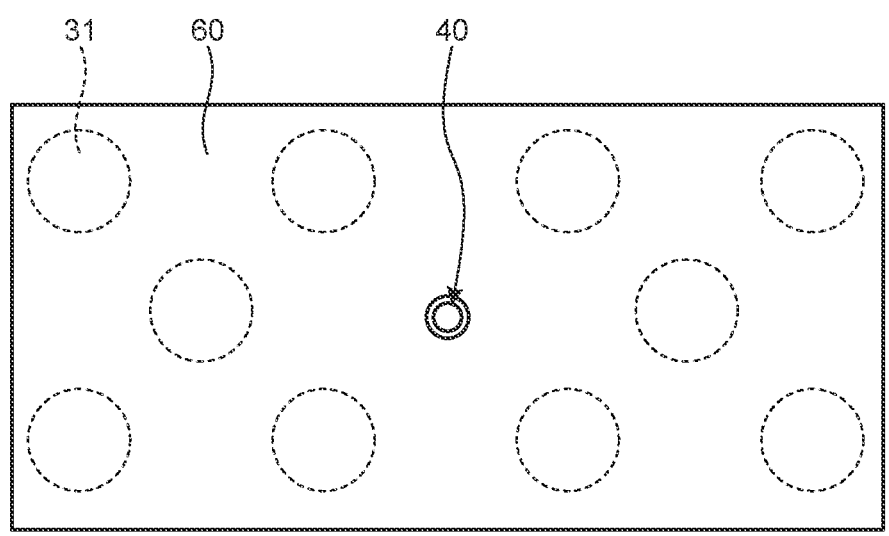
FIG. 8 is a schematic diagram for describing the example method of manufacturing the solid-state imaging device according to the first embodiment of the present disclosure.

FIG. 8 illustrates the structure of the solid-state imaging device 1 in FIG. 7 as viewed from above. In FIG. 8, positions at which RDVs 31 were formed are illustrated. Although FIG. 8 illustrates that 10 RDVs 31 were formed, this provides an example and is not to be construed as limiting the present disclosure. In the present disclosure, the number of RDVs 31 to be formed can be determined as desired depending on factors such as desired mechanical strength. Also, the position at which the RDV 31 is formed is not particularly limited, and the RDV 31 may be formed at any position depending on factors such as desired mechanical strength. In other words, the present disclosure provides an increased level of flexibility in layout of the support section 60.

Figure 9:
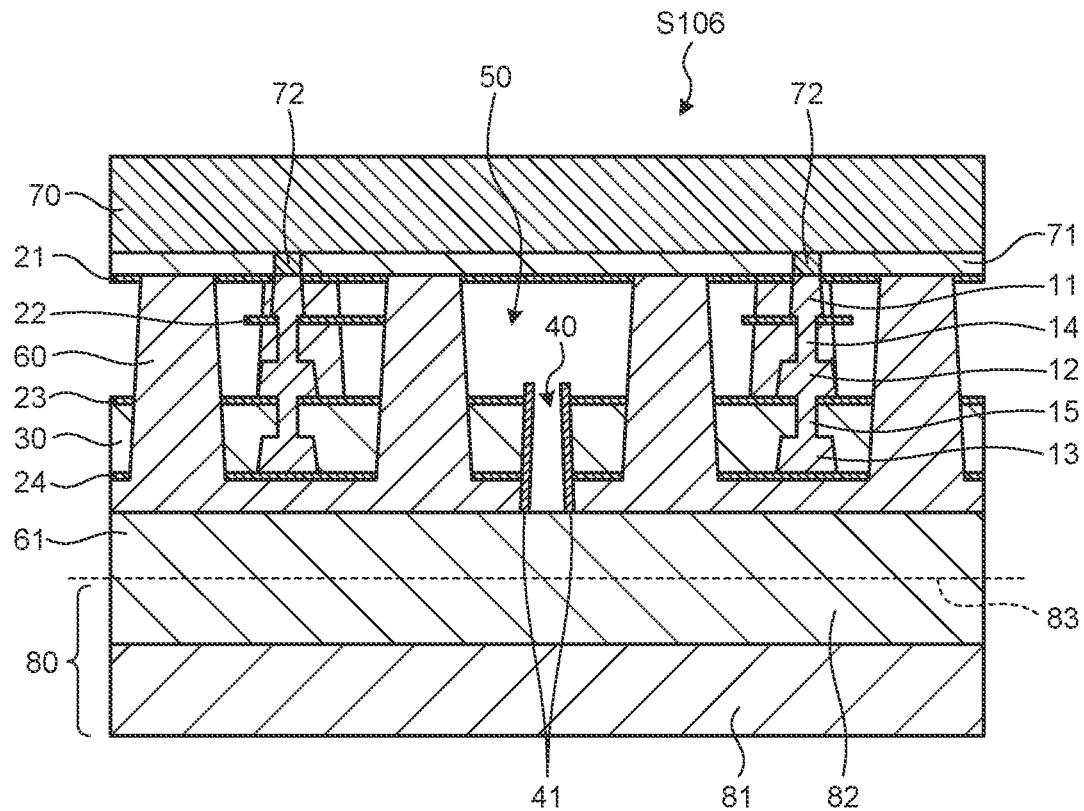
FIG. 9 is a schematic diagram illustrating an example configuration of a TEG according to the first embodiment of the present disclosure.

Subsequently, as illustrated in FIG. 9, the oxide film 61 having a relatively large thickness is formed on the upper surface of the support section 60 and is planarized by, for example, CMP. The support section 60 is then joined to the support substrate 80 in which the oxide film 82 is formed on the silicon wafer 81 (step S106). Specifically, the support substrate 80 is joined to the solid-state imaging device 1 as a lower support substrate thereof by plasma bonding the oxide film 61 on the support section 60 to the oxide film 82 on the silicon wafer 81. In FIG. 9, the joining face 83 processed by plasma bonding is illustrated.

Figure 10:
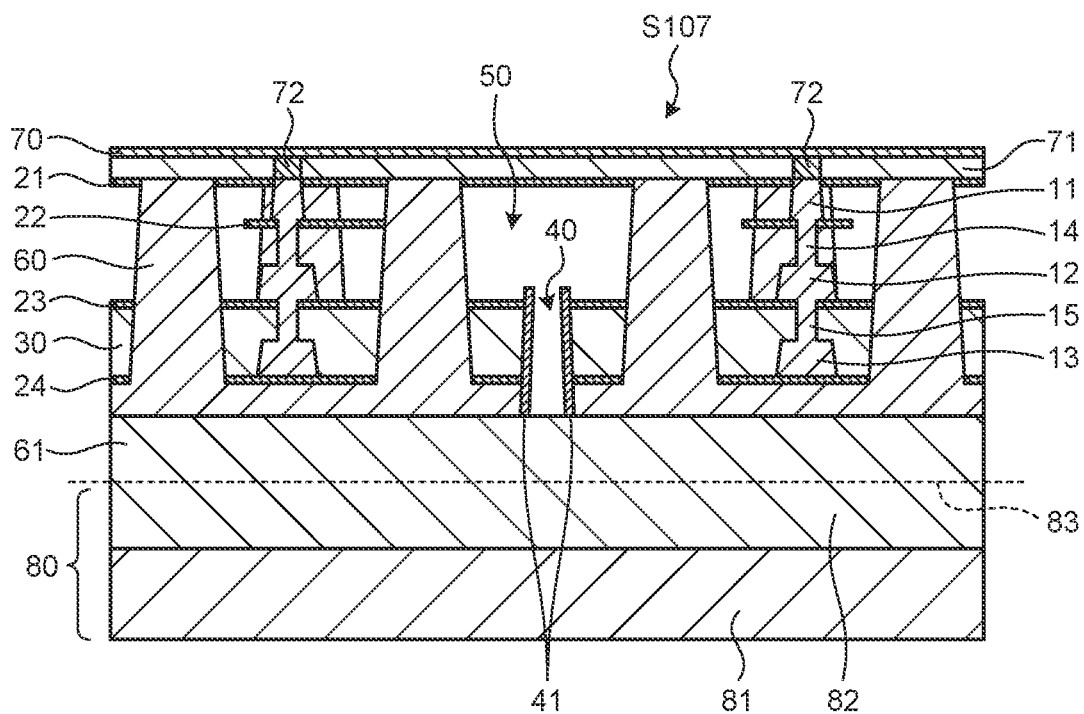
FIG. 10 is a schematic diagram for describing the example method of manufacturing the solid-state imaging device according to the first embodiment of the present disclosure.

Subsequently, as illustrated in FIG. 10, the mount substrate 70 for an image sensor or the like is reduced in thickness (step S107). Specifically, the thickness of the mount substrate 70 is reduced by polishing the mount substrate 70 with a grinder or performing CMP to the mount substrate 70. Since the support section 60 is structured to reinforce the multilayered wiring layer, the mechanical strength for withstanding the grinder or CMP can be secured. In other words, the support section 60 may be provided so as to withstand impact due to a grinder or CMP.

Then, by placing the photodiode 91 and the like on the mount substrate 70 after the reduction of the thickness thereof, the solid-state imaging device 1 as illustrated in FIG. 1 is formed.

Although the support section 60 is described above as having a columnar shape, this provides an example and is not to be construed as limiting the present disclosure.

Figure 11:
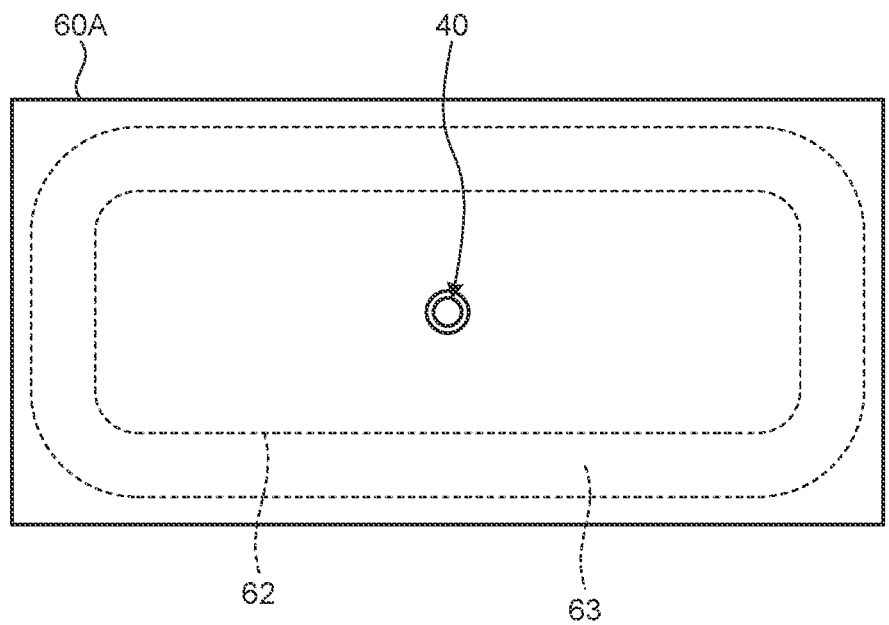
FIG. 11 is a schematic diagram for describing an example modification of a support section of the solid-state imaging device according to the first embodiment of the present disclosure.
Figure 12:
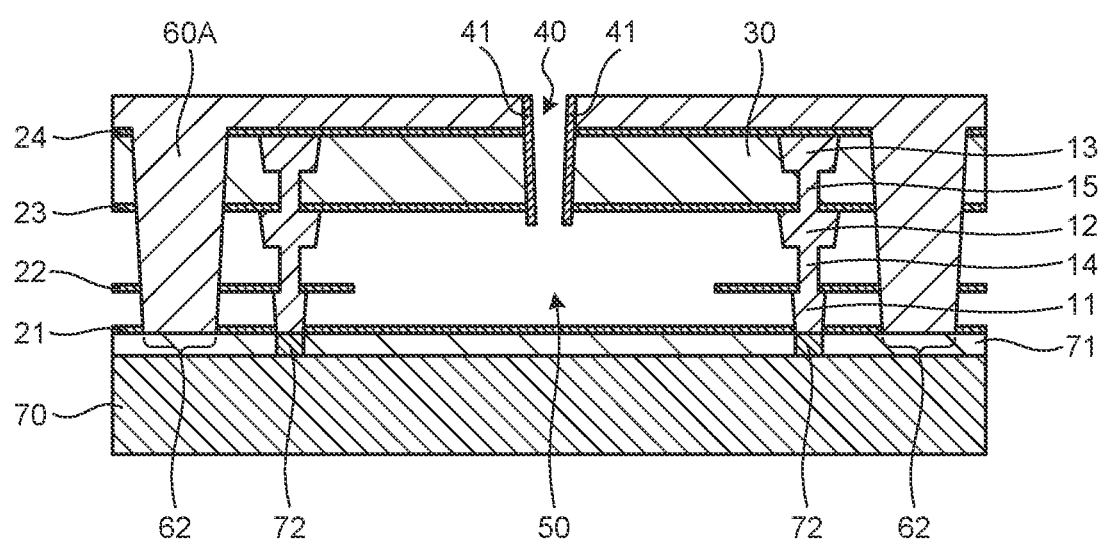
FIG. 12 is a schematic diagram for describing the example modification of the support section of the solid-state imaging device according to the first embodiment of the present disclosure.
Figure 13:
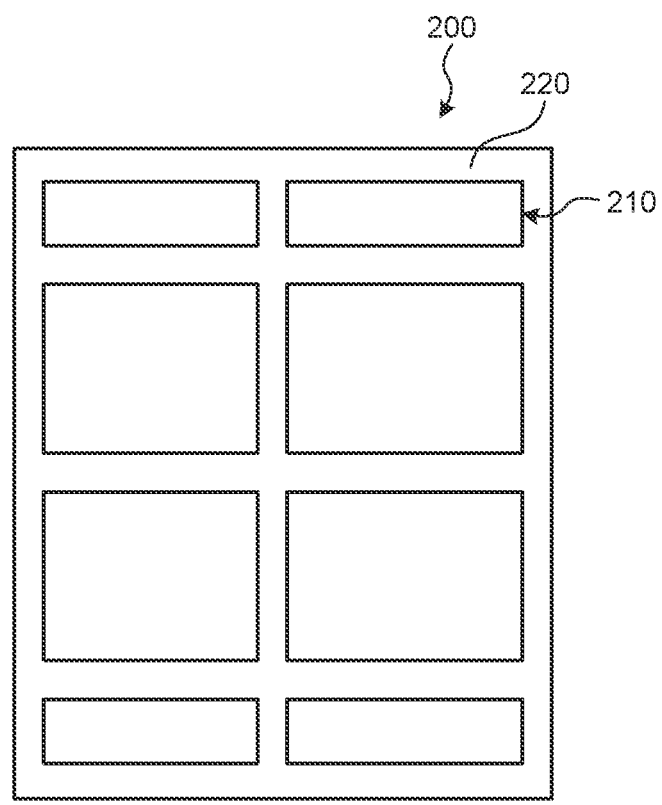
FIG. 13 is a schematic diagram illustrating an example configuration of a TEG layout.

A support section 60A according to a modification of the support section 60 is described below with reference to FIGS. 11, 12, and 13. FIG. 11 is a schematic diagram illustrating an example configuration of an upper surface of the support section 60A. FIG. 12 is a schematic diagram illustrating an example configuration of a section of the support section 60A. FIG. 13 is a schematic diagram illustrating an example configuration of a TEG (test element group) layout.

In FIG. 11, a guard ring region 62 and a scribe line 63 are illustrated. In the modification of the present embodiment, the support section 60A is formed by filling the scribe line 63 with a material having an etching resistance to wet etching.

In FIG. 12, a configuration of a section of the support section 60A is illustrated. As illustrated in FIG. 12, the support section 60A is formed along the scribe line 63. That is, the support section 60A is formed so as to, for example, surround the first wiring layer 11, the second wiring layer 12, and the third wiring layer 13.

In FIG. 13, a TEG layout 200 is illustrated. To form the support section 60A, for example, a scribe line forming section 220 surrounding a TEG chip 210 is changed to a groove section formed by a trench process. The resultant groove section is filled with a material having etching resistance to wet etching to thereby form the support section 60A. The support section 60A thus covers the (entire) peripheral area of the TEG chip 210, thus capable of securing mechanical strength. Also, since the support section 60A covers the peripheral area of a region, the configuration of the gap section 50 located in the region can be designed freely. The level of flexibility in layout of each wiring layer can be thus improved.

The size of the scribe line 63 is, for example, 10 μm to 100 μm. In this case, the depth of the scribe line 63 is, for example, 1350 to 1700 nm. This results in the aspect ratio of the size to depth being less than 1; thus, the scribe line 63 can be filled by CVD with a material having etching resistance to wet etching.

1-4. Modification of Support Section

In the first embodiment, the through hole is formed in the support section 60 as well as the insulation layer 30 at step S103, but this provides an example and is not to be construed as limiting the present disclosure.

Figure 14:
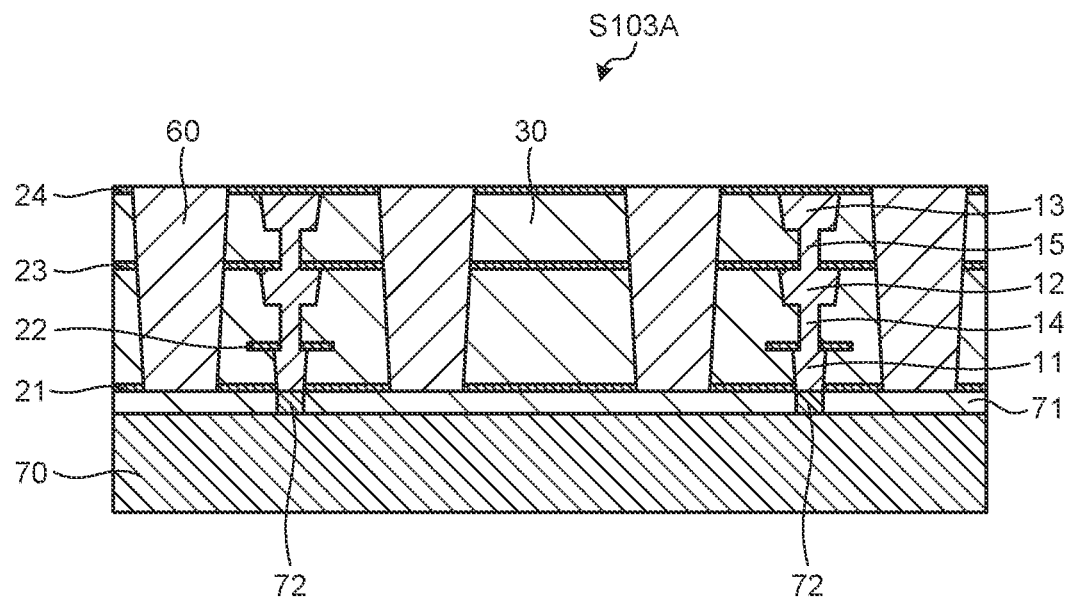
FIG. 14 is a schematic diagram for describing an example method of manufacturing a solid-state imaging device according to a first modification of an embodiment of the present disclosure.

As illustrated in FIG. 14, after step S102, the support section 60 formed on the insulation layer 30 may be removed (step S103A). In this case, the support section 60 formed on the insulation layer 30 is removed, for example, by an etch back process. Removing the support section 60 formed on the insulation layer 30 can reduce a material having a relatively high dielectric constant present within the solid-state imaging device 1.

Figure 15:
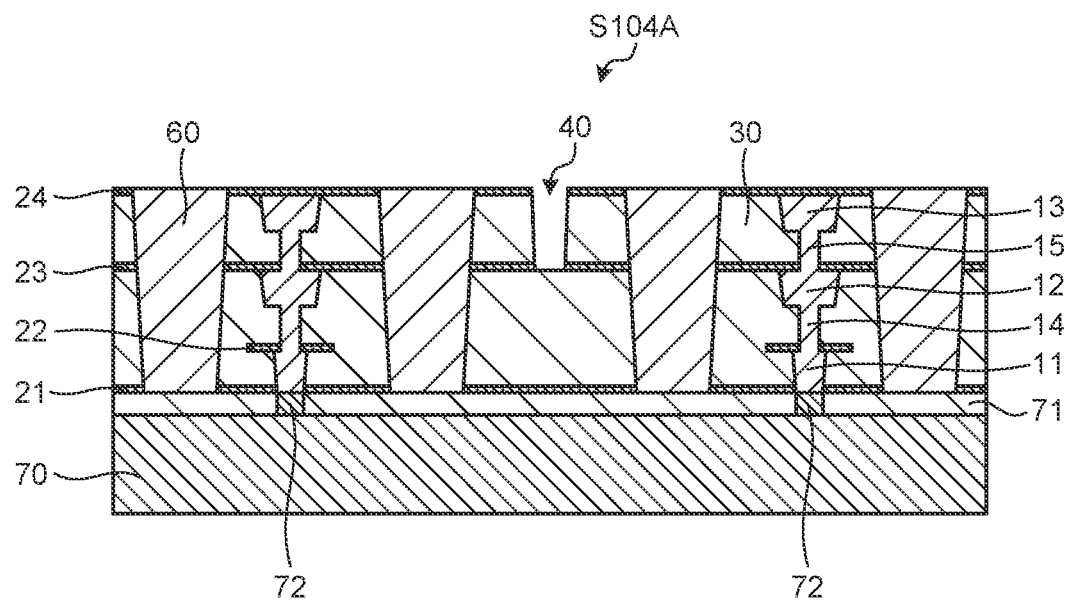
FIG. 15 is a schematic diagram for describing the example method of manufacturing the solid-state imaging device according to the first modification of the embodiment of the present disclosure.

Then, as illustrated in FIG. 15, the through hole 40 is formed (step S104A) in a similar manner to step S103.

Figure 16:
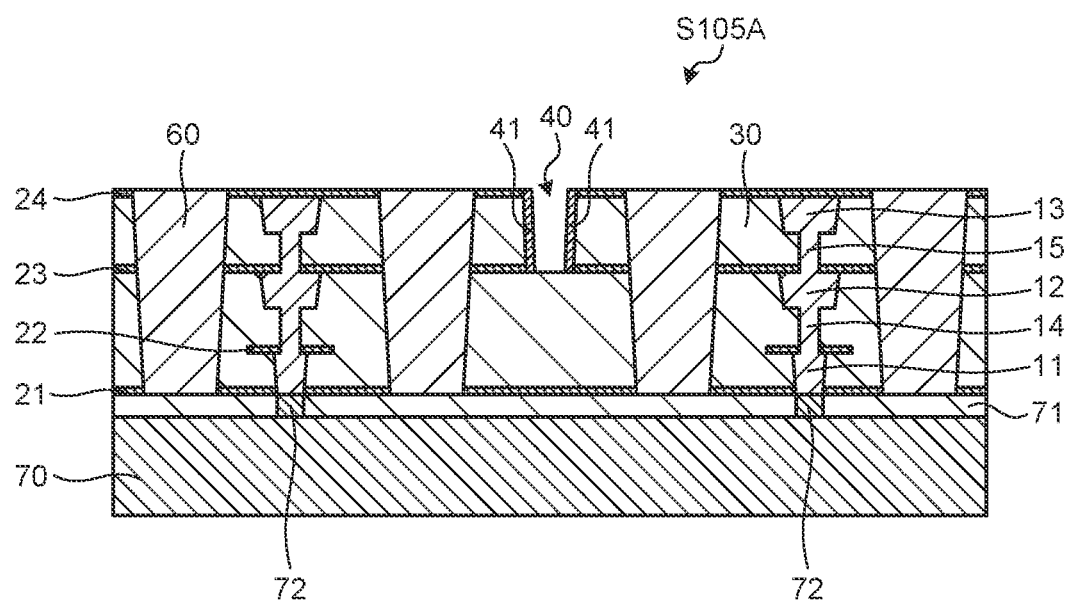
FIG. 16 is a schematic diagram for describing the example method of manufacturing the solid-state imaging device according to the first modification of the embodiment of the present disclosure.

Then, as illustrated in FIG. 16, the side wall protection film 41 is formed on the inner side of the through hole 40 and an etch back process is performed to the bottom surface (step S105A) in a similar manner to step S104.

Figure 17:
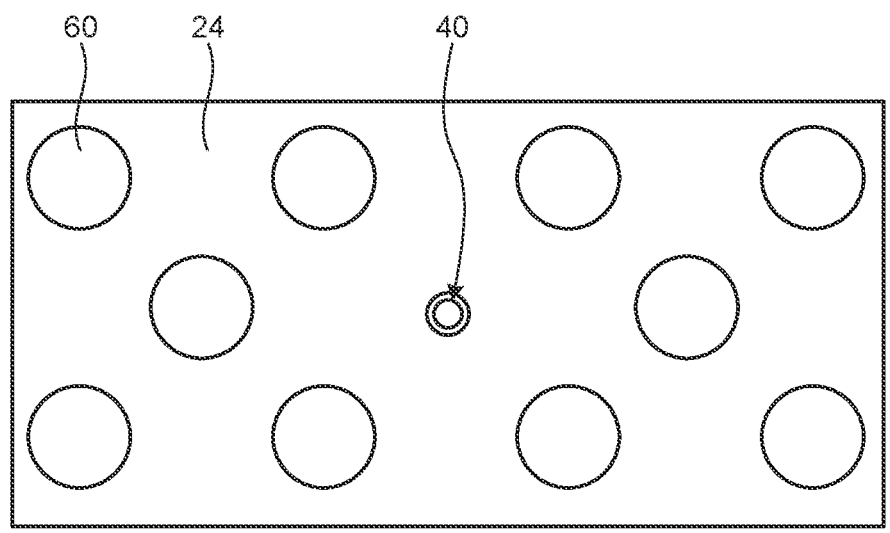
FIG. 17 is a schematic diagram for describing the example method of manufacturing the solid-state imaging device according to the first modification of the embodiment of the present disclosure.

FIG. 17 is a schematic diagram illustrating the solid-state imaging device 1 in the state of FIG. 16 as seen from above. As illustrated in FIG. 17, the fourth diffusion prevention layer 24 is exposed at the top of the solid-state imaging device 1. Support sections 60 are embedded only in RDVs 31.

Figure 18:
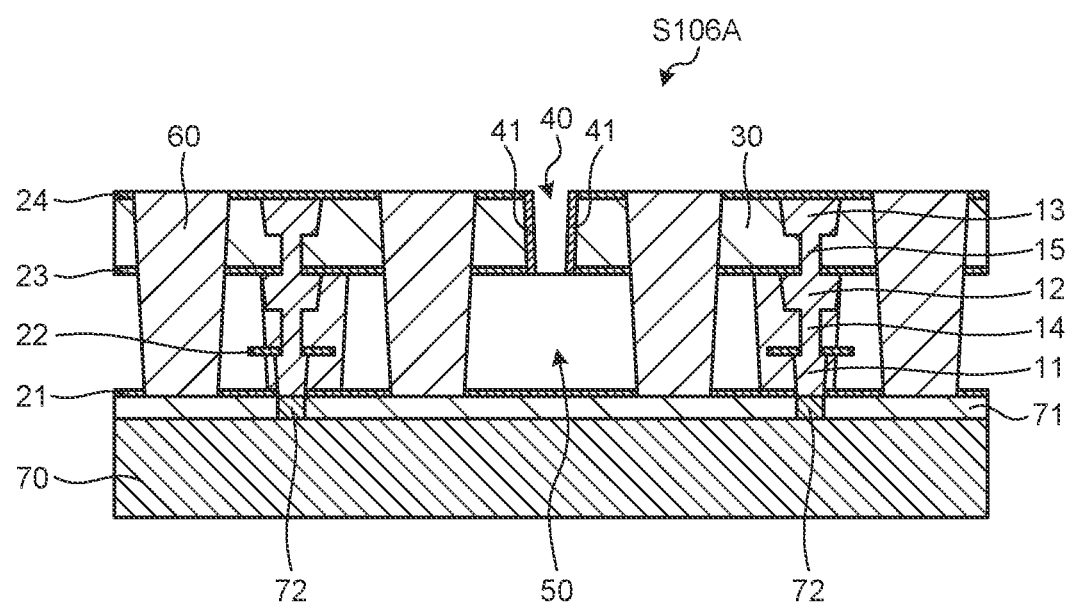
FIG. 18 is a schematic diagram for describing the example method of manufacturing the solid-state imaging device according to the first modification of the embodiment of the present disclosure.

Then, as illustrated in FIG. 18, the insulation layer 30 is removed to thereby form the gap section 50 (step S106A) in a similar manner to step S105.

Figure 19:
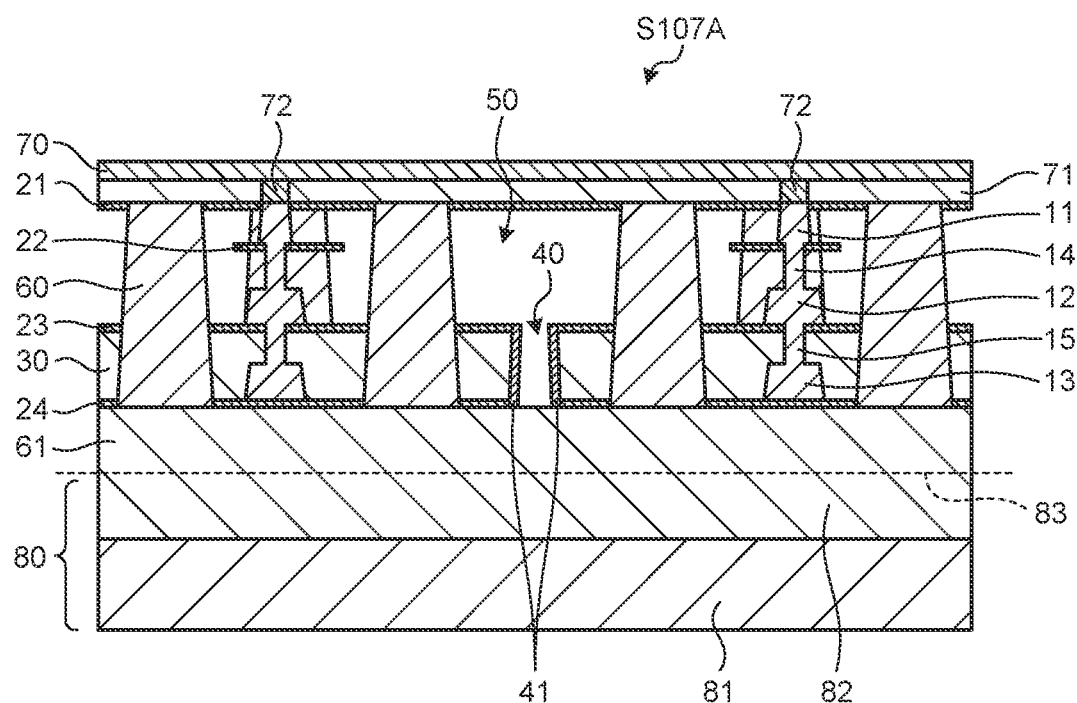
FIG. 19 is a schematic diagram for describing an example method of manufacturing a solid-state imaging device according to a second modification of the embodiment of the present disclosure.

Subsequently, as illustrated in FIG. 19, the support substrate 80 is joined in a similar manner to step S106. Then, the mount substrate 70 for an image sensor or the like is reduced in thickness (step S107A) in a similar manner to step S107. In the case of the modification also, by placing the photodiode 91 and the like on the mount substrate 70 after the reduction of the thickness thereof, the solid-state imaging device 1 as illustrated in FIG. 1 is formed.

2. Second Embodiment 2-1. Method of Manufacturing Solid-State Imaging Device

A method of manufacturing a solid-state imaging device according to a second embodiment of the present disclosure is described below with reference to FIGS. 20 to 23. FIGS. 20 to 23 are schematic diagrams for describing a method of manufacturing a solid-state imaging device according to the second embodiment of the present disclosure.

The method of manufacturing a solid-state imaging device according to the second embodiment is the same as the method of manufacturing a solid-state imaging layer according to the modification of the first embodiment up to step S106A, the description of which is thus omitted below.

Figure 20:
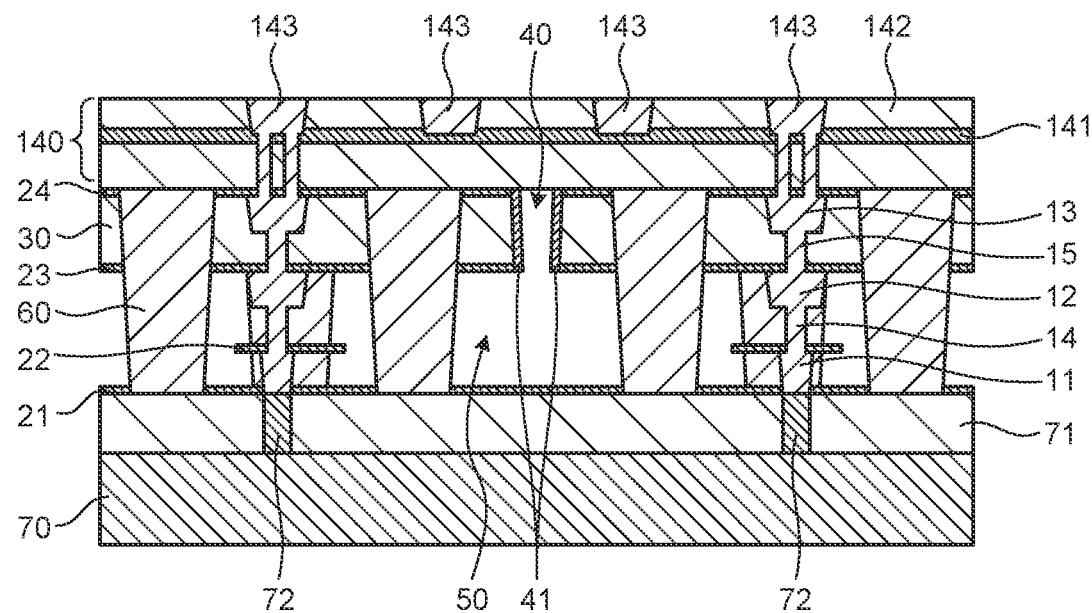
FIG. 20 is a schematic diagram for describing the example method of manufacturing the solid-state imaging device according to the second modification of the embodiment of the present disclosure.

As illustrated in FIG. 20, after step S106A, a Cu (copper) wiring layer 140, which includes a Cu pad 143, is placed on the insulation layer 30 (step S107B). Specifically, the Cu wiring layer 140 includes a silicon wafer 141, an oxide film 142, and the Cu pad 143 placed in the oxide film 142. In this case, the first wiring layer 11 is electrically connected to the Cu pad 143. Since the support section 60 on the insulation layer 30 is removed, signal transmission delay is prevented even with the formation of the Cu pad 143.

Figure 21:
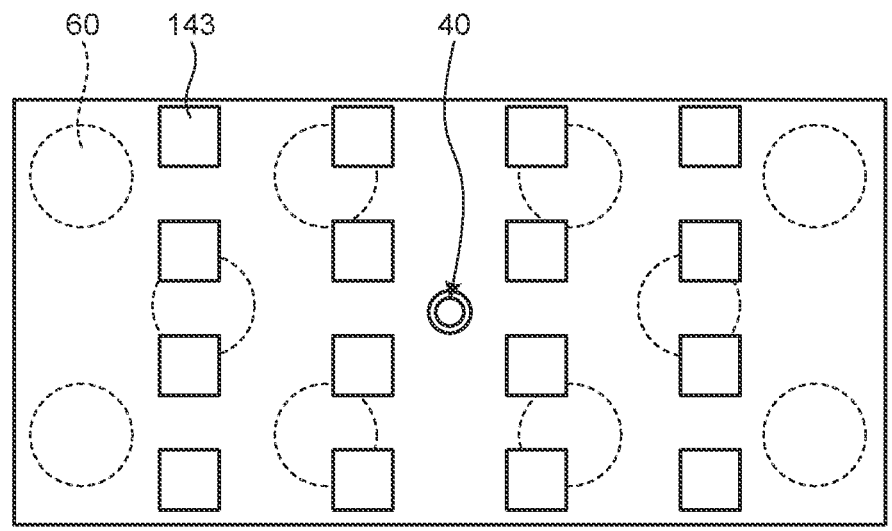
FIG. 21 is a schematic diagram for describing the example method of manufacturing the solid-state imaging device according to the second modification of the embodiment of the present disclosure.

FIG. 21 is a schematic diagram illustrating the Cu wiring layer 140 in FIG. 18 as seen from above. As illustrated in FIG. 21, the Cu wiring layer 140 includes a plurality of the Cu pads 143. The placement of the Cu pads 143 in FIG. 21 provides an example and is not to be construed as limiting the present disclosure. The number of the Cu pads 143 in FIG. 21 provides an example and is not to be construed as limiting the present disclosure. In the present disclosure, the placement and number of the Cu pads 143 can be changed as desired depending on the design.

Figure 22:
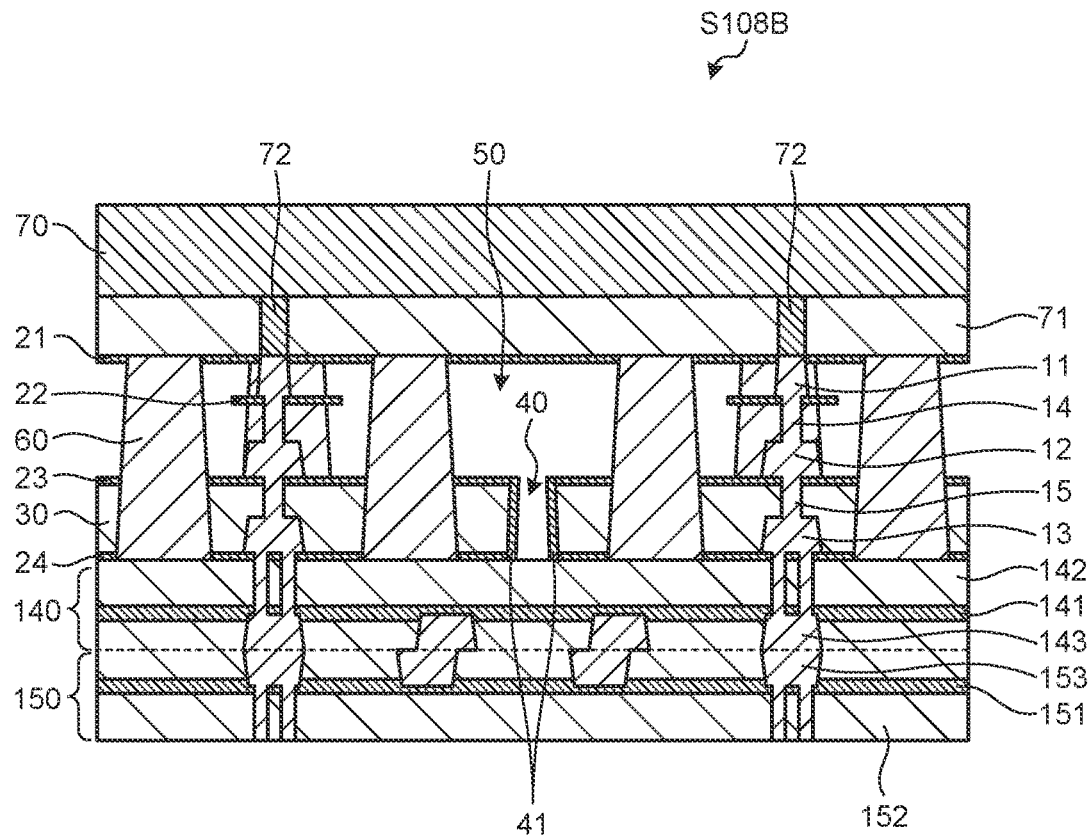
FIG. 22 is a schematic diagram for describing the example method of manufacturing the solid-state imaging device according to the second modification of the embodiment of the present disclosure.

Subsequently, as illustrated in FIG. 22, the Cu wiring layer 140 is coupled to a support substrate 150 of a solid-state imaging device (step S108B). Specifically, the support substrate 150 includes a silicon wafer 151, an oxide film 152, and a plurality of Cu Pads 153. In this case, the Cu wiring layer 140 and the support substrate 150 are coupled together by Cu—Cu coupling the Cu pads 143 of the Cu wiring layer 140 to the Cu Pads 153 of the support substrate 150.

Figure 23:
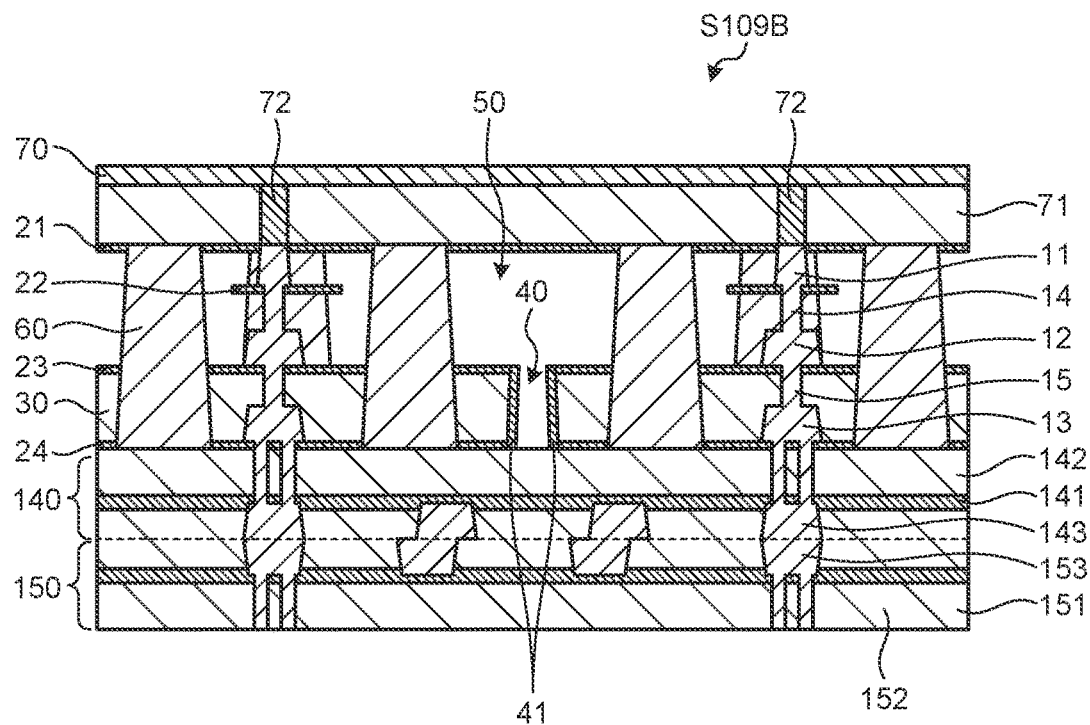
FIG. 23 is a schematic diagram for describing the example method of manufacturing the solid-state imaging device according to the second modification of the embodiment of the present disclosure.

Then, as illustrated in FIG. 23, the mount substrate 70 for an image sensor or the like is reduced in thickness (step S109B) in a similar manner to step S107. In the case of the second embodiment also, by placing the photodiode 91 and the like on the mount substrate 70 after the reduction of the thickness thereof, the solid-state imaging device 1 as illustrated in FIG. 1 is formed.

As described above, the present disclosure can be used when the solid-state imaging device 1 is manufactured by either plasma bonding or Cu—Cu bonding.

The present technique can have the following configurations.

(1)

A semiconductor device including:
- a multilayered wiring layer including an insulation layer and a diffusion prevention layer stacked alternately and including a wiring layer internally;
- a gap section disposed at least in a portion of the insulation layer; and
- a support section disposed at least in a portion of the gap section and configured to support the multilayered wiring layer.

(2)

The semiconductor device according to (1), wherein
the support section extends along a stacking direction of the insulation layer and the diffusion prevention layer and has a columnar shape.

(3)

The semiconductor device according to (1) or (2), wherein the support section is disposed across the multilayered wiring layer.

(4)

The semiconductor device according to any one of (1) to (3), wherein
the support section is made using a resisting material having resistance to a liquid for use in wet etching for forming the gap section.

(5)

The semiconductor device according to (4), wherein the support section is made using any one of SiN, SiC, and SiCO.

(6)

The semiconductor device according to (4), wherein the support section is made using metal.

(7)

The semiconductor device according to any one of (1) to (6), wherein
the gap section is disposed across a plurality of the insulation layers.

(8)

The semiconductor device according to (1) to (7), further including a semiconductor substrate joined to the multilayered wiring layer by plasma bonding.

(9)

The semiconductor device according to (1) to (8), further including a semiconductor substrate joined to the multilayered wiring layer by Cu—Cu bonding.

(10)

A solid-state imaging device including:
- a multilayered wiring layer including an insulation layer and a diffusion prevention layer stacked alternately and including a wiring layer internally;
- a gap section disposed at least in a portion of the insulation layer;
- a support section disposed at least in a portion of the gap section;
- a substrate disposed on a surface of the multilayered wiring layer; and
- a photoelectric conversion section disposed on the substrate.

(11)

A method of manufacturing a semiconductor device, the method including:
- forming a multilayered wiring layer including an insulation layer and a diffusion prevention layer stacked alternately and including a wiring layer internally;
- forming a hole portion in the multilayered wiring layer; and
- filling the hole portion with a resisting material having resistance to a liquid for use in wet etching, and forming a support section on a surface of the multilayered wiring layer by using the resisting material, the surface including the hole portion formed therein.

(12)

The method of manufacturing a semiconductor device according to (11), the method including:
- forming a through hole penetrating from a surface of the support section through at least one of a plurality of the insulation layers; and
- performing wet etching to at least one of the insulation layers immediately below the through hole so as to form a gap section.

(13)

The method of manufacturing a semiconductor device according to (12), the method including plasma bonding the multilayered wiring layer and a semiconductor substrate together.

(14)

The method of manufacturing a semiconductor device according to (11), the method including:
- performing an etch back process to remove the support section;
- forming a through hole penetrating from a surface of the resisting material through at least one of a plurality of the insulation layers; and
- performing wet etching to at least one of the insulation layers immediately below the through hole so as to form a gap section.

(15)

The method of manufacturing a semiconductor device according to (14), the method including Cu—Cu bonding the multilayered wiring layer and a semiconductor substrate together.

REFERENCE SIGNS LIST 1 solid-state imaging device
2 pixel array section
2a pixel
3 pixel drive circuit
4 DAC (digital to analog converter)
5 vertical drive circuit
6 timing generation circuit
7 output section
11 first wiring layer
12 second wiring layer
13 third wiring layer
14 first via hole
15 second via hole
21 first diffusion prevention layer
22 second diffusion prevention layer
23 third diffusion prevention layer
24 fourth diffusion prevention layer
30 insulation layer
40 through hole
41 side wall protection film
50 gap section
60 support section
61 oxide film
70 mount substrate
71 oxide film
72 contact plug
80 support substrate 81, 141, 151 silicon wafer
82, 142, 152 oxide film
90 semiconductor substrate
91 photodiode
100 planarization film
101 light shield film
110 color filter layer
121 on-chip lens
140 Cu wiring layer
143, 153 Cu pad
150 support substrate

The invention claimed is:

1. A semiconductor device, comprising:
a multilayered wiring layer that comprises:
at least one insulation layer that comprises a first material;
a plurality of diffusion prevention layers, wherein
at least one diffusion prevention layer of the plurality of diffusion prevention layers and the at least one insulation layer are stacked alternately, and
the plurality of diffusion prevention layers comprises a second material; and
a plurality of wiring layers, wherein the plurality of wiring layers and the plurality of diffusion prevention layers are stacked alternately;
a through hole that penetrates through the at least one insulation layer;
a protection film on an inner side of the through hole, wherein
the protection film includes a third material, and
the first material of the at least one insulation layer is different from the second material of the plurality of diffusion prevention layers and the third material of the protection film;
a gap section in a portion of the at least one insulation layer;
a support section in a portion of the gap section, wherein
the support section is configured to support the multilayered wiring layer, and
a position of the support section is based on a mechanical strength of the multilayered wiring layer that is less than a threshold value; and
an oxide film on a surface of the support section.

2. The semiconductor device according to claim 1, wherein
the support section extends along a stacking direction of the at least one insulation layer and the at least one diffusion prevention layer, and
the support section has a columnar shape.

3. The semiconductor device according to claim 2, wherein the support section is across the multilayered wiring layer.

4. The semiconductor device according to claim 1, wherein the support section includes a resisting material that has resistance to a liquid used in a wet etching process.

5. The semiconductor device according to claim 4, wherein the resisting material of the support section includes at least one of SiN, SiC, or SiCO.

6. The semiconductor device according to claim 4, wherein the resisting material of the support section includes a metal.

7. The semiconductor device according to claim 1, wherein the gap section is across the at least one insulation layer.

8. The semiconductor device according to claim 1, further comprising a semiconductor substrate joined to the multilayered wiring layer.

9. The semiconductor device according to claim 1, wherein
the second material of the at least one diffusion prevention layer includes SiC, and
the third material of the protection film includes SiCN.

10. A solid-state imaging device, comprising:
a multilayered wiring layer that comprises:
at least one insulation layer that comprises a first material;
a plurality of diffusion prevention layers, wherein
at least one diffusion prevention layer of the plurality of diffusion prevention layers and the at least one insulation layer are stacked alternately, and
the plurality of diffusion prevention layers comprises a second material; and
a plurality of wiring layers, wherein the plurality of wiring layers and the plurality of diffusion prevention layers are stacked alternately;
a through hole that penetrates through the at least one insulation layer;
a protection film on an inner side of the through hole, wherein
the protection film includes a third material, and
the first material of the at least one insulation layer is different from the second material of the plurality of diffusion prevention layers and the third material of the protection film;
a gap section in a portion of the at least one insulation layer;
a support section in a portion of the gap section, wherein a position of the support section is based on a mechanical strength of the multilayered wiring layer is less than a threshold value;
an oxide film on a surface of the support section;
a substrate on the oxide film; and
a photoelectric conversion section on the substrate.

11. A method of manufacturing a semiconductor device, the method comprising:
forming a multilayered wiring layer that comprises:
at least one insulation layer that comprises a first material;
a plurality of diffusion prevention layers, wherein
at least one diffusion prevention layer of the plurality of diffusion prevention layers and the at least one insulation layer are stacked alternately, and
the plurality of diffusion prevention layers comprises a second material; and
a plurality of wiring layers, wherein the plurality of wiring layers and the diffusion prevention layers are stacked alternately;
forming a hole portion in the multilayered wiring layer;
filling the hole portion with a resisting material having resistance to a liquid for use in wet etching;
forming a support section on a surface of the multilayered wiring layer by using the resisting material, wherein a position of the support section is based on a mechanical strength of the multilayered wiring layer that is less than a threshold value;
forming a through hole penetrating through the at least one insulation layer;
forming a protection film on an inner side of the through hole, wherein
the protection film includes a third material, and
the first material of the at least one insulation layer is different from the second material of the plurality of diffusion prevention layers and the third material of the protection film; and forming an oxide film on a surface of the support section, wherein the oxide film is on a side of the through hole.

12. The method of manufacturing the semiconductor device according to claim 11, the method further comprising:
   forming the through hole penetrating from the surface of the support section through the at least one insulation layer; and
   performing the wet etching to the at least one insulation layer below the through hole to form a gap section.

13. The method of manufacturing the semiconductor device according to claim 12, the method further comprising plasma bonding the multilayered wiring layer and a semiconductor substrate together.

14. The method of manufacturing the semiconductor device according to claim 11, the method further comprising:
   performing an etch back process to remove the support section;
   forming the through hole penetrating from the surface of the resisting material through the at least one insulation layer; and
   performing the wet etching to the at least one insulation layer below the through hole to form a gap section.

15. The method of manufacturing the semiconductor device according to claim 14, the method further comprising Cu—Cu bonding the multilayered wiring layer and a semiconductor substrate together.

* * * * *